(12) United States Patent
Kim et al.

(10) Patent No.: US 9,412,842 B2
(45) Date of Patent: Aug. 9, 2016

(54) METHOD FOR FABRICATING SEMICONDUCTOR DEVICE

(71) Applicants: SAMSUNG ELECTRONICS CO., LTD., Gyeonggi-do (KR); INTERNATIONAL BUSINESS MACHINES CORPORATION, Armonk, NY (US)

(72) Inventors: Jin-Bum Kim, Seoul (KR); Kyung-Bum Koo, Gyeonggi-do (KR); Taek-Soo Jeon, Gyeonggi-do (KR); Tae-Ho Cha, Gyeonggi-do (KR); Judson R Holt, Wappingers Falls, NY (US); Henry K Utomo, Newburgh, NY (US)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/934,369

(22) Filed: Jul. 3, 2013

(65) Prior Publication Data
US 2015/0011070 A1 Jan. 8, 2015

(51) Int. Cl.
| | |
|---|---|
| H01L 29/66 | (2006.01) |
| H01L 29/78 | (2006.01) |
| H01L 29/165 | (2006.01) |
| H01L 21/8234 | (2006.01) |

(52) U.S. Cl.
CPC .. *H01L 29/66636* (2013.01); *H01L 21/823412* (2013.01); *H01L 21/823418* (2013.01); *H01L 29/165* (2013.01); *H01L 29/66628* (2013.01); *H01L 29/7834* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 6,599,803 B2 | 7/2003 | Weon et al. | |
| 7,060,576 B2 | 6/2006 | Lindert et al. | |
| 7,332,439 B2 | 2/2008 | Lindert et al. | |
| 7,335,959 B2 | 2/2008 | Curello et al. | |
| 2002/0089003 A1 | 7/2002 | Lee | |
| 2002/0109135 A1 | 8/2002 | Murota et al. | |
| 2006/0081896 A1 | 4/2006 | Maeda | |
| 2009/0068810 A1 | 3/2009 | Tsai et al. | |
| 2010/0311218 A1 | 12/2010 | Fukutome et al. | |
| 2012/0088342 A1* | 4/2012 | Ming et al. | 438/230 |
| 2012/0309152 A1* | 12/2012 | He et al. | 438/285 |
| 2013/0316506 A1* | 11/2013 | Chang et al. | 438/285 |
| 2014/0175556 A1* | 6/2014 | Chen | H01L 21/82380 257/369 |

FOREIGN PATENT DOCUMENTS

JP 2011-091291 5/2011

* cited by examiner

*Primary Examiner* — Julio J Maldonado
*Assistant Examiner* — Stanetta Isaac
(74) *Attorney, Agent, or Firm* — F. Chau & Associates, LLC

(57) ABSTRACT

A gate pattern is formed on a first region of a substrate. An epitaxial layer is formed on a second region of the substrate. A recess is formed in the second region of the substrate by etching the epitaxial layer and the substrate underneath. The first region is adjacent to the second region.

20 Claims, 10 Drawing Sheets

METHOD FOR FABRICATING SEMICONDUCTOR DEVICE

TECHNICAL FIELD

The present inventive concept relates to a method for fabricating a semiconductor device.

DISCUSSION OF RELATED ART

Due to high demand for semiconductor devices having a high operating speed, and accurate operation, various structures for transistors have been proposed to meet these demands.

SUMMARY

According to an exemplary embodiment of the inventive concept, a method for fabricating a semiconductor device is provided. A gate pattern is formed on a first region of a substrate. An epitaxial layer is formed on a second region of the substrate. A recess is formed in the second region of the substrate by etching the epitaxial layer and the substrate underneath. The first region is adjacent to the second region.

According to an exemplary embodiment of the inventive concept, a method for fabricating a semiconductor device is provided. A first gate pattern and a second gate pattern adjacent to the first gate pattern are formed on a PMOS transistor forming region of a substrate defined by an isolation layer. A first epitaxial layer is formed on the substrate between the isolation layer and the first gate pattern. A second epitaxial layer is formed on the substrate between the first gate pattern and the second gate pattern. A first recess is formed between the isolation layer and the first gate pattern and a second recess is formed between the first gate pattern and the second gate pattern by etching the first epitaxial layer, the second epitaxial layer and the substrate.

According to an exemplary embodiment of the inventive concept, a method for fabricating a semiconductor device is provided. A first gate pattern and a second gate pattern are formed on a substrate. An epitaxial layer is formed on the substrate and is formed between the first and the second gate patterns. The epitaxial layer includes a facet sidewall and the epitaxial layer has a predetermined thickness. A recess is formed between the first and the second gate patterns by etching the epitaxial layer and the substrate underneath. The recess undercuts the first and the second gate patterns and has a first tip under the first gate pattern and a second tip under the second gate pattern.

BRIEF DESCRIPTION OF THE DRAWINGS

These and other features of the inventive concept will become more apparent by describing in detail exemplary embodiments thereof with reference to the accompanying drawings in which.

DETAILED DESCRIPTION OF THE EMBODIMENTS

Figure 1:
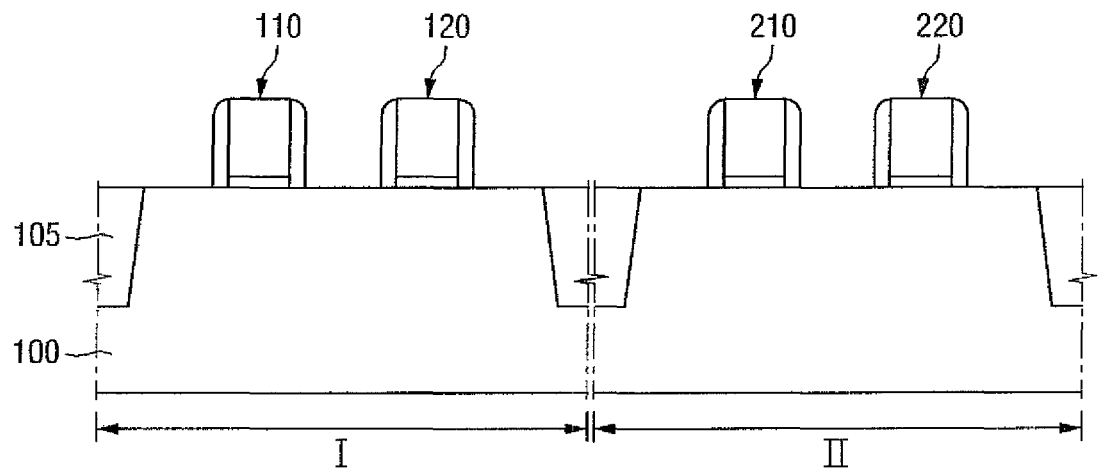
FIGS. 1 to 7 are cross-sectional views illustrating process steps in a method for fabricating a semiconductor device according to an exemplary embodiment of the inventive concept.

Exemplary embodiments of the inventive concept will be described in detail herein with reference to the accompanying drawings. However, the inventive concept may be embodied in different forms and should not be construed as limited to the exemplary embodiments set forth herein. In the drawings, the thickness of layers and regions may be exaggerated for clarity.

It will be understood that when an element or layer is referred to as being "connected to," or "coupled to" another element or layer, it may be directly connected to or coupled to another element or layer or intervening elements or layers may be present. Like numbers may refer to like elements throughout the specification and drawings.

It will also be understood that when a layer is referred to as being "on" another layer or substrate, it may be directly on the other layer or substrate, or intervening layers may also be present.

As used herein, singular "a," "an," and "the" may be intended to cover the plural forms as well, unless the context indicates otherwise.

Hereinafter, a method for fabricating a semiconductor device according to an embodiment of the inventive concept will be described with reference to FIGS. 1 to 7.

FIGS. 1, 2A, 3, 4A, 5A, 6 and 7 are cross-sectional views illustrating process steps in a method for fabricating a semiconductor device according to an exemplary embodiment of the inventive concept. FIGS. 2B, 4B and 5B illustrate examples, which may be different from those as illustrated in 2A, 4A, and 5A, respectively, of a method for fabricating a semiconductor device according to an exemplary embodiment of the inventive concept.

Referring to FIG. 1, first to fourth gate patterns 110, 120, 210, and 220 are formed on a substrate 100. For example, the first and second gate patterns 110 and 120 are formed on the substrate 100 in a first active region I. The third and fourth gate patterns 210 and 220 are formed on the substrate 100 in a second active region II. The first active region I and the second active region II are spaced apart from each other by an isolation layer 105.

According to an exemplary embodiment of the inventive concept, the first active region I of the substrate 100 may be a PMOS (P-type Metal Oxide Semiconductor) transistor formation region, and the second active region II of the substrate 100 may be an NMOS (N-type Metal Oxide Semiconductor) transistor formation region, but the inventive concept is not limited thereto.

The isolation layer 105 is formed by filling a trench formed in the substrate 100 with an insulating material. The isolation layer 105 is formed in the boundary between the first active region I and the second active region II. The first active region I and the second active region II are defined by the isolation layer 105 formed in the substrate 100. For example, the isolation layer 105 may include a shallow trench isolation (STI) structure, but the inventive concept is not limited thereto.

The substrate 100 may include bulk silicon or a silicon-on-insulator (SOI). Alternatively, the substrate 100 may include a silicon substrate or may include other materials, such as silicon germanium, indium antimonide, lead telluride, indium arsenide, indium phosphide, gallium arsenide or gallium antimonide.

Hereinafter, exemplary embodiments of the inventive concept will be described as having the substrate 100 including a silicon substrate for simplicity of explanation.

The first to fourth gate patterns 110, 120, 210, and 220 include a gate insulation layer, a gate electrode and a spacer.

The gate insulation layer may include, for example, SiO, SiON, $Ge_xO_yN_z$, $Ge_xSi_yO_z$, a high dielectric constant material, or combinations thereof, and may be formed as a stacked layer including these materials being sequentially stacked. The high dielectric constant material may include, but is not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate. The gate insulation layer may be formed by, for example, an atomic layer deposition (ALD) process or a chemical vapor deposition (CVD) process. If the gate insulation layer includes a high-k dielectric, a barrier layer (not shown) may further be formed between the gate insulation layer and the gate electrode. The barrier layer may include, for example, titanium nitride (TiN), tantalum nitride (TaN) or a combination thereof.

The gate electrode may include polycrystalline silicon (poly-Si) or amorphous silicon (a-Si). Alternatively, the gate electrode may include a metal electrode including a metallic material. The gate electrode may be formed by, for example, a sputtering process, a CVD process, or a plasma deposition process, but the inventive concept is not limited thereto.

The spacer may include, for example, SiN, SiON, $SiO_2$, or SiOCN. The spacer may be formed by, for example, a CVD process. The spacer is formed in a single layer, but the inventive concept is not limited thereto. For example, the spacer may have a multi-layered structure.

The spacer may be formed by, for example, a CVD process.

Although not shown in FIG. 1, a gate hard mask layer may further be formed on the gate electrode of each of the first to fourth gate patterns 110, 120, 210, and 220. The gate hard mask layer serves to protect the gate electrode from etch damages occurred in a subsequent process. The gate hard mask layer may include, for example, nitride, oxide, or a combination thereof, and may be formed by, for example, a CVD process.

Figure 2A:
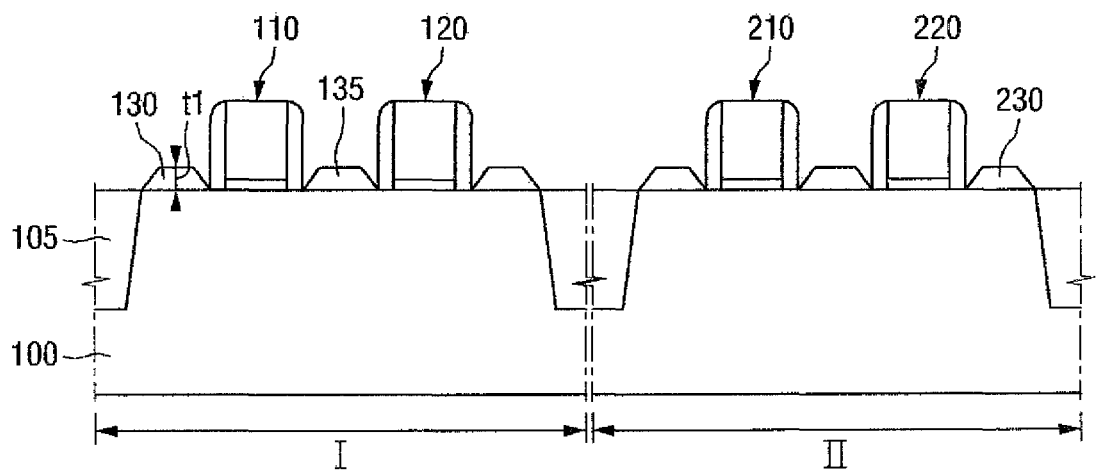
Figure 2B:
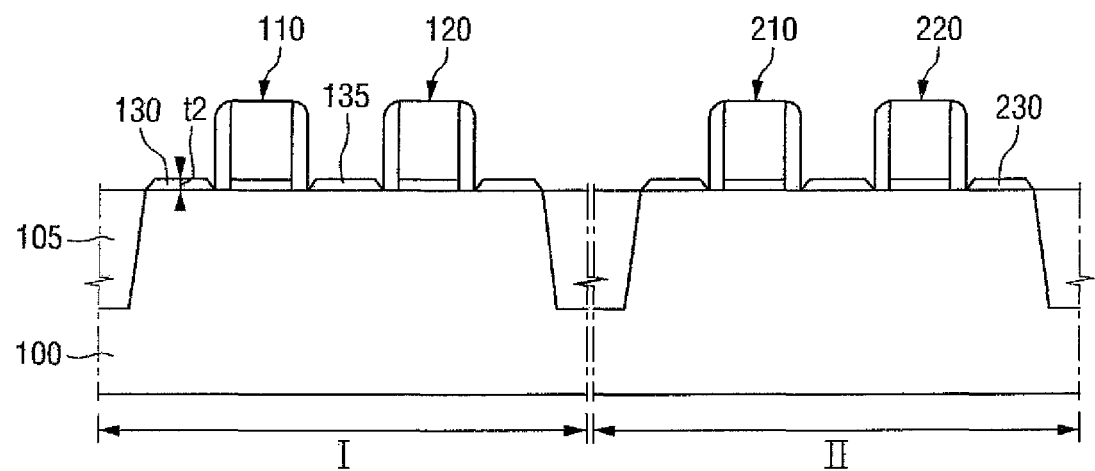

Referring to FIG. 2A, a first sacrificial epitaxial layer 130 and a second sacrificial epitaxial layer 135 are formed on the substrate 100 in the first active region I. An elevated source/drain 230 is formed on the substrate in the second active region II.

For example, the first sacrificial epitaxial layer 130 is formed between the isolation layer 105 and the first gate pattern 110. The second sacrificial epitaxial layer 135 is formed between the first gate pattern 110 and the second gate pattern 120. The first sacrificial epitaxial layer 130 and the second sacrificial epitaxial layer 135 are epitaxially grown from a top surface of the substrate 100 in the first active region I. In addition, the elevated source/drain 230 is also epitaxially grown from the top surface of the substrate in the second active region II.

The first sacrificial epitaxial layer 130, the second sacrificial epitaxial layer 135, and the elevated source/drain 230 may be simultaneously formed in an epitaxy growth process.

The epitaxy growth process may be controlled so that the first and second sacrificial layers 130 and 135 have a substantially same thickness t1 as the elevated source/drain 230.

The first sacrificial epitaxial layer 130 and the second sacrificial epitaxial layer 135 may include, for example, a silicon epitaxial layer or a silicon germanium epitaxial layer. The elevated source/drain 230 may also include a silicon epitaxial layer or a silicon germanium epitaxial layer. Since the elevated source/drain 230 may serve as a source/drain of a transistor formed on substrate 100 in the second active region II, the elevated source/drain 230 may include, but is not limited thereto, impurities such as boron (B), carbon (C), phosphorus (P) and/or arsenic (As). For example, the sacrificial epitaxial layers 130 and 135 and the elevated source/drain 230 may each include the same impurity therein.

The epitaxy growth process may include, for example, an ALD process or a CVD process.

The epitaxy growth process may be controlled so that the first sacrificial epitaxial layer 130 includes a sidewall having a facet. The facet sidewall of the first sacrificial epitaxial layer 130 is sloped at an angle with respect to the top surface of the substrate 100. For example, when the first sacrificial epitaxial layer 130 is a silicon epitaxial layer, the facet of the first sacrificial epitaxial layer 130 may have a (111) crystal plane.

Alternatively, the epitaxy growth process may be controlled so that the first and second sacrificial epitaxial layers 130 and 135 need not include a facet sidewall. For example, the first and second epitaxial layers 130 and 135 may include a facet-free epitaxial layer formed by varying processing conditions of the epitaxy growth process.

FIG. 2B illustrates a cross section of a first sacrificial epitaxial layer 130 and a second sacrificial epitaxial layer 135 having a thickness t2 formed using substantially the same fabricating process as that of FIG. 2A. The first and second sacrificial epitaxial layers 130 and 135 of FIG. 2A have different thicknesses from those of FIG. 2B. For example, the first sacrificial epitaxial layers 130 and 135 may have the thickness t1, as shown in FIG. 2A, or the thickness t2, as shown in FIG. 2B. According to an exemplary embodiment of the inventive concept, the thickness t1 of the first and second sacrificial epitaxial layers 130 and 135 of FIG. 2A is greater than the thickness t2 of the first and second sacrificial epitaxial layers 130 and 135 of FIG. 2B. The thickness of the sacrificial epitaxial layer of FIG. 2A and that of FIG. 2B correspond to a step difference of the sidewall facet of the first and second sacrificial epitaxial layers 130 and 135.

In FIGS. 1, 2A and 2B, boundary surfaces between the gate patterns 110, 120, 210, and 220 and the substrate 100 are coplanar with a top surface of the isolation layer 105.

Alternatively, the boundary surfaces need not be coplanar with the top surface of the isolation. For example, in the course of forming the isolation layer 105, the top surface of the isolation layer 105 may be lower than the boundary surfaces. In such a case, the boundary surfaces may be higher than the top surface of the isolation layer 105, and a sloping surface may be formed between the substrate 100 and the isolation layer 105.

Figure 5A:
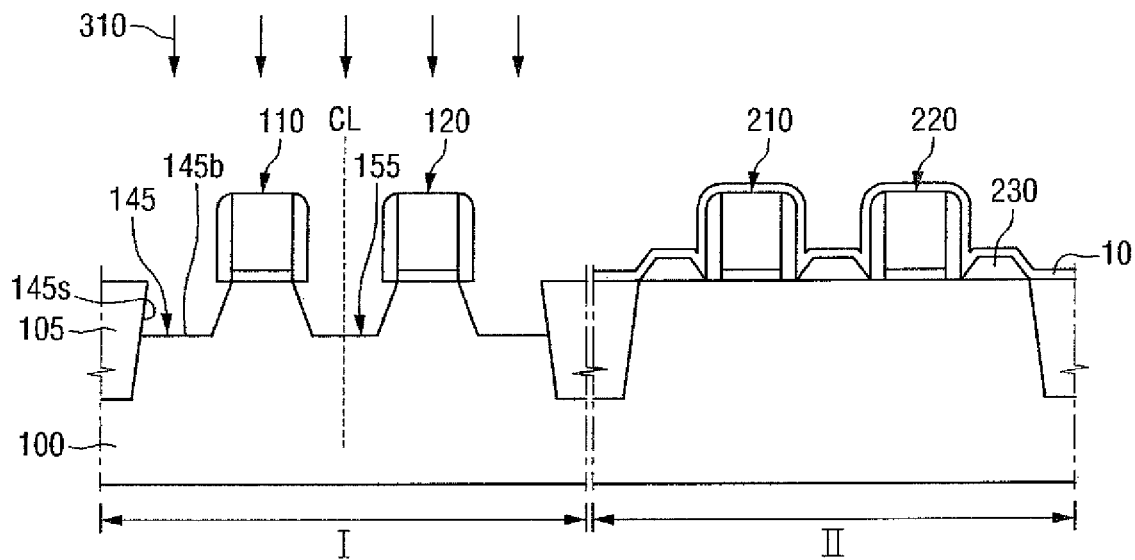

Due to the sloping surface between the substrate 100 and the isolation layer 105, a bottom surface of a recess, which will be explained later, may have a different shape from that described in FIGS. 5A and 5B. FIGS. 5A and 5B show a bottom surface of a recess when the boundary surfaces are coplanar with the top surface of the isolation layer 105.

Figure 3:
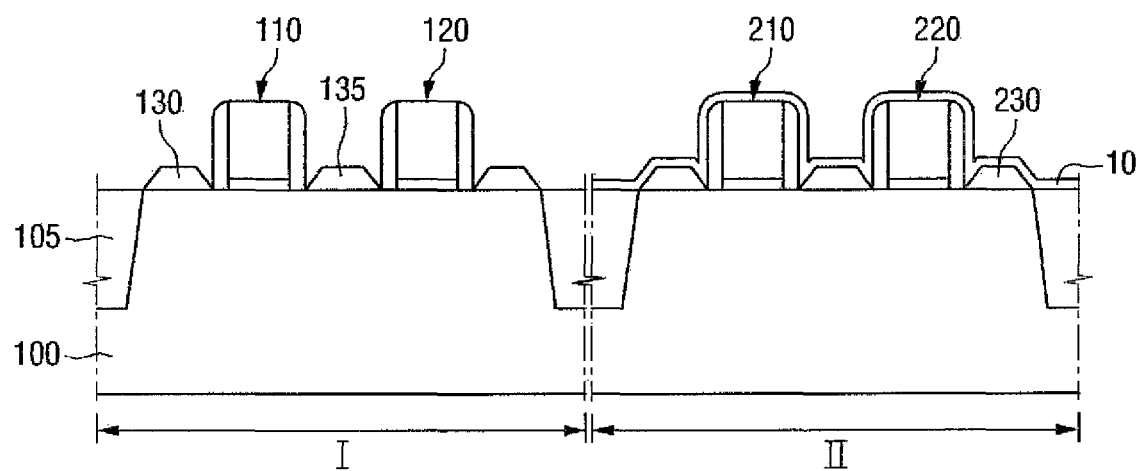

Referring to FIG. 3, a blocking pattern 10 is formed in the second active region II.

For example, a blocking layer is formed on the substrate 100 in the first active region I and the second active region II.

The blocking layer is formed on the first to fourth gate patterns 110, 120, 210, and 220, the first and second sacrificial epitaxial layers 130 and 135 and the elevated source/drain 230. The blocking layer may include, for example, silicon oxide, silicon nitride and/or silicon oxynitride. The blocking layer may be formed by, for example, a CVD process.

Thereafter, the blocking layer formed on the substrate 100 in the first active region I is removed, thereby exposing the first gate pattern 110, the second gate pattern 120, the first sacrificial epitaxial layer 130 and the second sacrificial epitaxial layer 135 in the first active region I. At substantially the same time, the blocking pattern 10 is formed on the substrate 100 in the second active region II. The blocking pattern 10 is formed on the third gate pattern 210, the fourth gate pattern 220 and the second source/drain 230. According to an exemplary embodiment, after the blocking layer on the first active region I is removed, the blocking layer may partially remain, covering on the spacers of the first gate patterns 110 and 120.

Figure 4A:
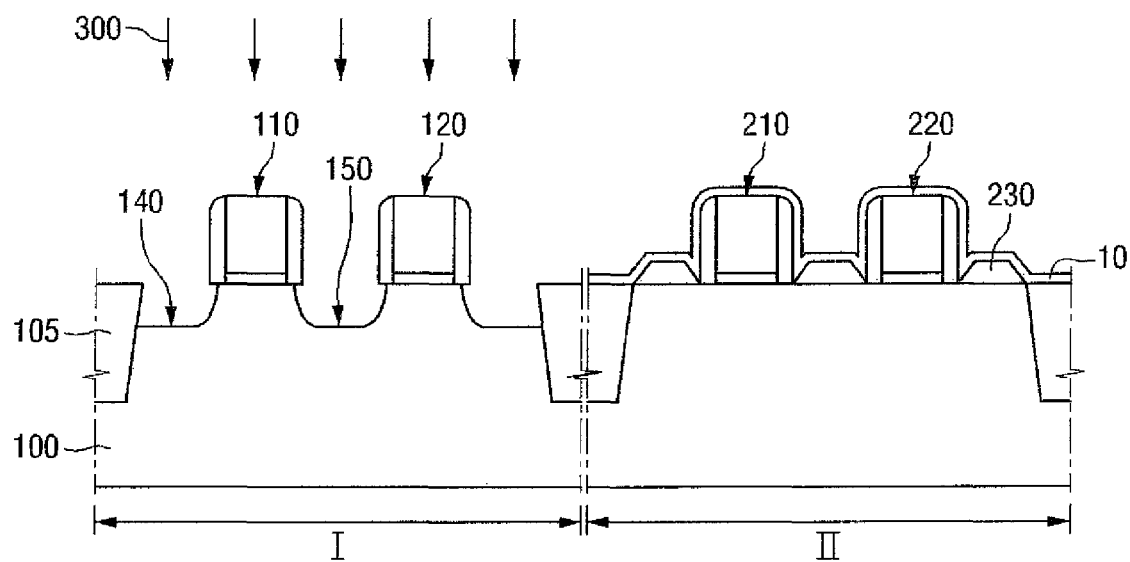
Figure 4B:
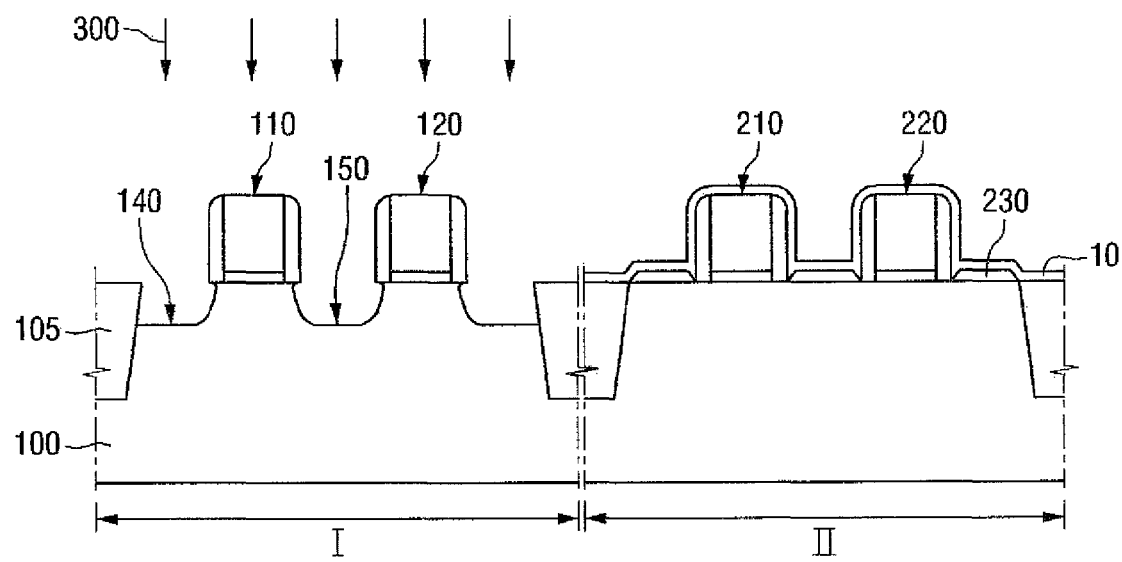
Figure 5B:
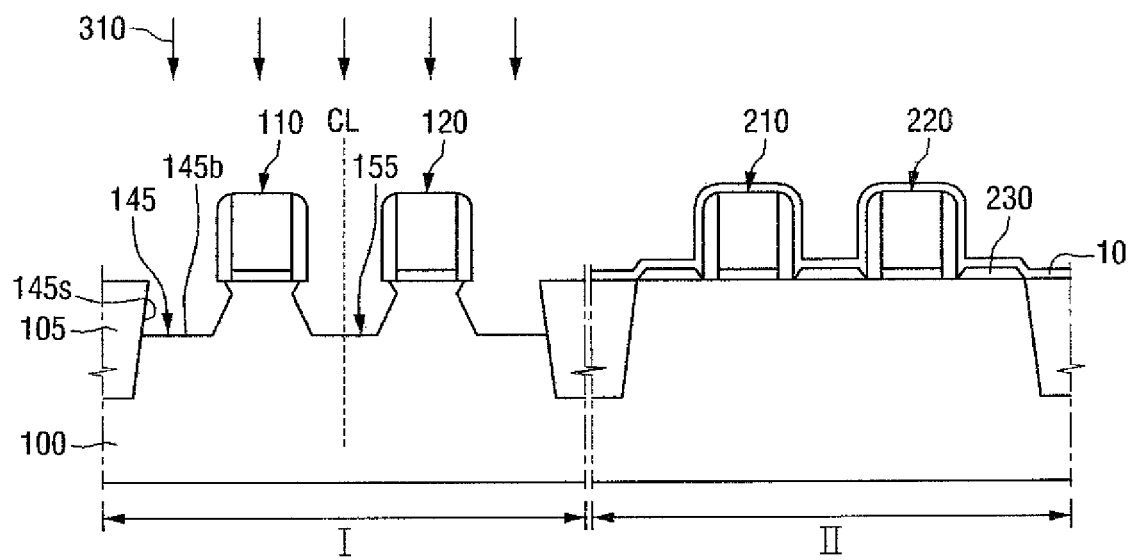

Referring to FIG. 4A, a first recess 140 and a second recess 150 are formed in the first active region I by etching the first sacrificial epitaxial layer 130, the second sacrificial epitaxial layer 135 and the substrate 100 underneath using a first etching process 300. For example, the first recess 140 is formed between the first gate pattern 110 and the isolation layer 105. The second recess 150 is formed between the first gate pattern 110 and the second gate pattern 120.

In the first etching process 300, the first sacrificial epitaxial layer 130 may be first removed, and once a portion of the 100 substrate beneath is exposed, the first sacrificial epitaxial layer 130 and the substrate 100 may be simultaneously removed. The first recess 140 and the second recess 150 may be simultaneously formed in the first etching process.

The first etching process 300 may include, for example, a dry etching process. In the first etching process 300, plasma, for example, may be or might not be used. The first etching process 300 may be, for example, an anisotropic etching process or an isotropic etching process using an etchant gas such as carbon tetrafluoride ($CF_4$) hydrogen bromide (HBr) or chlorine ($Cl_2$), but the inventive concept is not limited thereto.

Top surfaces and/or facets of the first sacrificial epitaxial layer 130 and the second sacrificial epitaxial layer 135 are first removed in the first etching process 300. The sidewall facets of the first and second sacrificial epitaxial layers 130 and 135 may be gradually removed from the gate structure and/or the isolation layer 105, exposing a portion of the substrate underneath.

For example, the sacrificial epitaxial layers 130 and 135 have a facet sidewall having thickness gradually reduced toward the first sacrificial epitaxial layer 130 and the second sacrificial epitaxial layer 135, and thus a portion of the substrate 100 adjacent to the gate structures 110 and 120 may be first exposed. Once the portion of the substrate 100 is exposed, the first etching process 300 may be continuously performed to form a recess 140.

In the first etching process, the recesses 140 and 150 undercut the gate structures 110 and 120. For example, the recesses 140 and 150 undercut the gate structures 110 and 120. The substrate 100 underneath the first gate pattern 110 and the second gate pattern 120 is removed. After the first sacrificial epitaxial layer 130 and the second sacrificial epitaxial layer 135 are removed, the first etching process 300 is continuously performed, thereby forming the first recess 140 between the first gate pattern 110 and the isolation layer 105 and between the second gate pattern 120 and the isolation layer 105 and forming the second recess 150 between the first gate pattern 110 and the second gate pattern 120.

Sectional shapes of the first recess 140 and the second recess 150 may be different from the profiles of the first sacrificial epitaxial layer 130 and the second sacrificial epitaxial layer 135. The sectional shapes of the first recess 140 and the second recess 150 shown in FIGS. 4A and 4B are provided only for the sake of convenient explanation, but the inventive concept are not limited thereto.

The first and second recesses 140 and 150 undercut the first gate pattern 110 and the second gate pattern 120. For example, as the result of forming the first recess 140, the substrate 100 positioned between the isolation layer 105 and the first gate pattern 110 and between the isolation layer 105 and the second gate pattern 120 is partially removed under the first gate pattern 110 and the second gate pattern 120. In addition, the first gate pattern 110 and the second gate pattern 120 are undercut below the first gate pattern 110 and the second gate pattern 120. Accordingly, portions of the first gate pattern 110 and the second gate pattern 120 overhang the first and second recesses 140 and 150 and are not disposed on the substrate 100. A boundary width between the first gate pattern 110 and the substrate 100 having the first and second recesses 140 and 150 is smaller than a bottom width of the first gate pattern 110.

The first recess 140 exposes a side surface of the isolation layer 105. A side surface of the first recess 140 adjacent to the isolation layer 105 may share a side surface of the isolation layer 105. For example, the side surface of the first recess 140 adjacent to the isolation layer 105 may be the side surface of the isolation layer 105.

FIG. 4B illustrate a cross section of the first recess 140 and the second recess 150 formed by a substantially same fabricating process as that of FIG. 4A, but the first and second recesses 140 and 150 of FIG. 4B have different side surface profiles than those of FIG. 4A.

For example, as shown in FIG. 4A, the first recess 140 and the second recess 150 have curved side surfaces, and tangent lines along the curved side surface have positive slopes whose angle is less than 45 degree measured counter-clockwise from the boundary between the gate structure 110 and the substrate 100. Alternatively, the first and second recesses 140 and 150 may have curved side surfaces whose tangent lines along the side surfaces negative slopes whose angle is greater than 135 degree measured counter-clockwise from the boundary between the gate structure 110 and the substrate 100.

In contrast, the first and second recesses 140 and 150 of FIG. 4B have different curved side surfaces than those of FIG. 4A. For example, the first and second recesses 140 and 150 of FIG. 4B have a side surface whose tangent line slopes change from a positive slope to a negative slope when measured from the bottom of the recess to the boundary. The tangent line having a positive slope has an angle of greater than 45 degree, and the tangent line having a negative slope has an angle greater than 90 degree and less than 135 degree.

According to an exemplary embodiment, when a thickness of the curved side surface is greater than a critical value, the curved surface includes tangent lines having positive slopes along the curved surface, and when the thickness of the curved side surface is less than the critical value, the curved surface includes tangent lines changing from a positive slope to a negative slope as the curved surface approaches the first gate pattern.

Referring to FIGS. 5A and 5B, a second etching process 310 is performed on the resulting structure of FIGS. 4A and 4B to form a third recess 145 and a fourth recess 155. The second etching process 310 may include, for example, a wet etching process using an etchant having different etch rate depending on a crystallographic orientation of a substrate.

For example, the etchant includes ammonium hydroxide (NH$_4$OH), but the inventive concept is not limited thereto.

For example, the etchant including ammonium hydroxide (NH$_4$OH) has the lowest etch rate with respect to a silicon surface having a (111) crystal plane and thus (110) crystal plane may serve as an etch stop. Accordingly, the curved surface of recesses 140 of FIGS. 4A and 4B having a crystal plane other than a (111) crystal plane is etched relatively faster than the (111) crystal plane, and thus the recesses 140 of FIGS. 4A and 4B change to the recesses having a side surface of a (111) crystal plane.

The third recess 145 and the fourth recess 15 may have either a sigma (Σ) shaped profile or a wedge shaped profile (e.g., a "V" shape lying sideways. For example, referring to FIG. 5A, the third and fourth recesses 145 and 155 has a side surface having a (111) plane and having a straight line profile in a cross-section view. Here, tips of the third recess 145 and the fourth recess 155 may be positioned on a boundary surface between the first gate pattern 110 and the substrate 100. Referring to FIG. 5B, the third and fourth recesses 145 and 155 have sigma (Σ) shaped profiles. The sigma (Σ) shaped profile may also be referred to a hexagonal shape. Here, tips of the third recess 145 and the fourth recess 155 are separated from a boundary surface between the first gate pattern 110 and the substrate 100.

The fourth recess 155 is substantially symmetrically formed in view of a center line CL equally spaced from the first gate pattern 110 and the second gate pattern 120.

However, sectional shapes of the third recess 145 formed between the isolation layer 105 and the first gate pattern 110 and between the isolation layer 105 and the second gate pattern 120 may be shaped of a combination of a box-shaped section and a sigma or wedge shaped section. For example, a side surface 145s of the third recess 145 adjacent to the isolation layer 105 may be a portion of a side surface of the isolation layer 105, and a bottom surface 145b of the third recess 145 is in contact with the side surface of the isolation layer 105.

Hereinafter, the difference in shapes of the recesses of FIG. 5A and FIG. 5B will be described with reference to FIGS. 2A, 4A, 5A, 2B, 4B and 5B.

The step difference of the facet sidewalls between the sacrificial epitaxial layers 130 and 135 of FIG. 2A and the sacrificial epitaxial layers 130 and 135 of FIG. 2B may cause the profile difference of the third and fourth recesses 145 and 155 of FIG. 5A and the third and fourth recesses 145 and 155 of FIG. 5B. For example, as shown in FIG. 2A, when the sacrificial epitaxial layers 130 and 135 are relatively thick, the sidewall facet of the sacrificial epitaxial layers 130 and 135 have a relatively large step difference between the top surfaces of the sacrificial epitaxial layers 130 and 135 and the top surface of the substrate 100. In the first etching process 300 of FIG. 4A, an etchant gas such as carbon tetrafluoride (CF$_4$) hydrogen bromide (HBO or chlorine (Cl$_2$) may be reflected from the facet sidewall and may be directed into the substrate under the gate structures 110 and 120. Such reflected etchant gas may partially remove the substrate 100 under the gate patterns 110 and 120. According to an exemplary embodiment, the thickness t1 of the first and second sacrificial epitaxial layers 130 and 135 is set so as to cause the curved side surfaces of the first and second recesses 140 and 150 to have a positive slope in the first etching process 300. In the second etching process 310 using a wet etching process, portions of the curved side surfaces of the first and second recesses 140 and 150 having a crystal plane other than a (111) plane may be removed relatively fast compared to the (111) plane, so the third and fourth recesses 145 and 155 have profiles of a lying-sideways "V" and have a side surface of an (111) crystal plane.

However, when the step difference of the facet sidewall of the first and second sacrificial epitaxial layers 130 and 135 is t2 smaller than t1, the third recess 145 and the fourth recess 155 may have sigma (Σ) shaped profiles. For example, in the first etching process 300, the first and second recesses 140 and 150 have a curved side surface whose tangent lines have slopes changing from a positive slope to a negative slope as the curved sidewall approaches to the gate patterns 110 and 120. As explained above, the curved side surfaces having a crystal plane other than a (111) crystal plane are etched relatively fast in the second etching process 310 compared to the (111) crystal plane. Accordingly, the third and fourth recesses have two (111) planes mirrored each other, and thus have sigma (Σ) shaped profiles. The sigma (Σ) shaped profiles have a tip where two mirrored (111) crystal planes meet each other.

According to an exemplary embodiment, the step difference in the sidewall facet of the first and second sacrificial epitaxial layers 130 and 135 formed on the first active region I may be adjusted by changing the thickness thereof, thereby making the recesses adjacent to the gate patterns 110 and 120 have profiles of a lying-sideways "V" or sigma (Σ) shaped profiles. Further, tips of the sigma shaped profiles may be positioned at a predetermined position by adjusting the step difference in the sidewall facet of the first and second sacrificial layers 130 and 135.

Subsequent process steps are performed in a substantially similar manner as described above with reference to FIGS. 5A and 5B.

Figure 6:
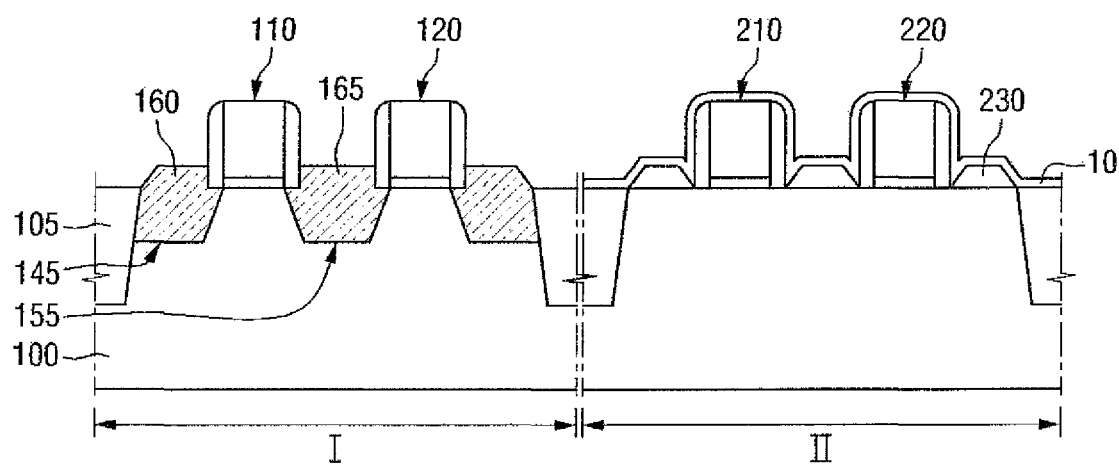

Referring to FIG. 6, a first semiconductor pattern 160 and a second semiconductor pattern 165 are formed in the third recess 145 and the fourth recess 155, respectively. The first and second semiconductor patterns 160 and 165 may be formed on the top surface of the substrate 100. For example, the first and second semiconductor patterns 160 and 165 may be elevated from the boundary between the first gate pattern 110 and the substrate 100, but the inventive concept is not limited thereto. The first and second semiconductor patterns 160 and 165 may apply tensile or compressive stress to channel regions underneath the first and second gate patterns 110 and 120, thereby increasing electron/hole mobility within the channel regions. The first and second semiconductor patterns 160 and 165 may be a source/drain of a transistor formed in the first active region I. The first and second semiconductor patterns 160 and 165 may be formed by epitaxially growing a semiconductor material in the third recess 145 and the fourth recess 155. For example, the first semiconductor pattern 160 and the second semiconductor pattern 165 may be single crystal epitaxial layers. The first semiconductor pattern 160 and the second semiconductor pattern 165 may be formed by, for example, a CVD process or an ALD process. The first semiconductor pattern 160 and the second semiconductor pattern 165 may include materials having different lattice constants from the substrate 100, but the inventive concept is not limited thereto.

For a PMOS transistor, compressive stress may be applied to increase hole mobility in the channel of the substrate 100. The first semiconductor pattern 160 and the second semiconductor pattern 165 may include a material having a greater lattice constant than the substrate 100. For example, in a case of a silicon (Si) substrate, the first semiconductor pattern 160 and the second semiconductor pattern 165 may include silicon germanium (SiGe) having a greater lattice constant than Si.

For an NMOS transistor, tensile stress may be applied to the channel of the substrate 100 to increase electron mobility in the channel of the substrate 100. The first semiconductor pattern 160 and the second semiconductor pattern 165 may include a material having a smaller lattice constant than the substrate 100. For example, in a case of a silicon (Si) substrate, the first semiconductor pattern 160 and the second semiconductor pattern 165 may include silicon carbide (SiC) having a smaller lattice constant than Si. According to an exemplary embodiment, the first semiconductor pattern 160 and the second semiconductor pattern 165 may form an elevated silicon epitaxial layer.

Figure 7:
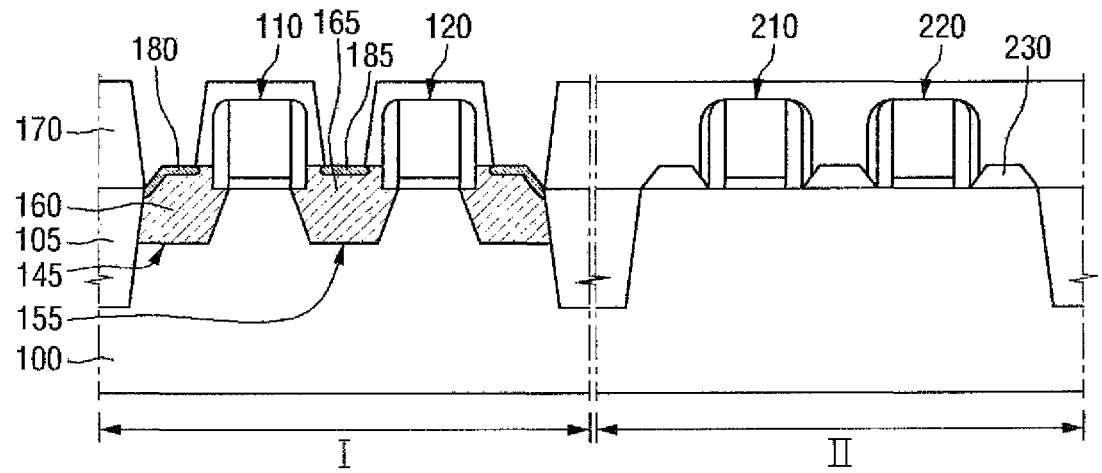

Referring to FIG. 7, a first silicide layer 180 and a second silicide layer 185 are formed on the first and second semiconductor patterns 160 and 165 in the first active region I. However, the inventive concept is not limited thereto. For example, a silicide layer may be formed both on the first and second semiconductor patterns 160 and 165 in the first active region I and the source/drain 230 of the second active region II. In this case, the first source/drain 160 and 165 of the first active region I and the source/drain 230 of the second active region II are both exposed for a silicidation process.

For example, the blocking pattern 10 formed in the second active region II may be removed, thereby exposing the source/drain 230. According to an exemplary embodiment, impurities may be injected into the exposed source/drain 230.

Thereafter, an interlayer insulating layer 170 including an opening exposing the first semiconductor pattern 160 and the second semiconductor pattern 165 of the first active region I is formed on the substrate 100. The interlayer insulating layer 170 may include, for example, silicon oxide or a low-k dielectric material, and may be doped with impurities, but the inventive concept is not limited thereto. The interlayer insulating layer 170 may be formed by, for example, a high density plasma deposition process or a CVD process. The interlayer insulating layer 170 may be formed in a single deposition step. Alternatively, the interlayer insulating layer 170 may be formed through multiple deposition steps.

Thereafter, a metal layer (not shown) is deposited on the first semiconductor pattern 160 and the second semiconductor pattern 165 exposed by the opening of the interlayer insulating layer 170. The metal layer may include Ni, Pt, Ti, Ru, Rh, Co, Hf, Ta, Er, Yb, W, or combinations thereof. The metal layer may be formed by, for example, a physical vapor deposition process, a CVD process, and an ALD process. The metal layer may have a predetermined thickness so that a portion of the first semiconductor pattern 160 and the second semiconductor pattern 165 may be changed to silicide in an annealing process. In the annealing process, metal atoms of the metal layer are diffused into the first and second semiconductor pattern 160 and 165, and the semiconductor patterns 160 and 165 may be partially changed to silicide, thereby forming a first silicide layer 180 and a second silicide layer 185 on the first semiconductor pattern 160 and the second semiconductor pattern 165. Subsequently, unreacted metal layer is removed by an etching or cleaning process.

The first silicide layer 180 formed on the first semiconductor pattern 160 is spaced apart from a bottom surface of the third recess 145 which is a boundary surface between the first semiconductor pattern 160 and the substrate 100. As described above, the first silicide layer 180 is spaced apart from the substrate 100, and thus the first silicide layer 180 and the substrate 100 are not in contact with each other in the case that the first silicide layer 180 is rapidly formed toward the substrate 100. For example, the side surface of the third recess 145 adjacent to the isolation layer 105 has, for example, a box-shaped cross section, rather than a sigma-shaped cross section. The first silicide layer 180 may be rapidly grown along the boundary surface between the first semiconductor pattern 160 and the isolation layer 105, but the first silicide layer 180 may be formed within the first semiconductor pattern 160, thereby preventing a leakage current path between the silicide layer 180 and the substrate 100. Accordingly, the reliability of the semiconductor device may be increased.

Hereinafter, a method for fabricating a semiconductor device according to an exemplary embodiment of the inventive concept will be described with reference to FIGS. 1 and 8 to 12. This embodiment is substantially the same as the method described above, except that a source/drain is not formed on the substrate in a second active region II. Thus, the same functional component is denoted by the same reference numeral and repeated explanations thereof will be briefly given or will not be given.

FIGS. 8 to 12 are cross-sectional views illustrating process steps in a method for fabricating a semiconductor device according to an exemplary embodiment of the inventive concept.

Figure 8:
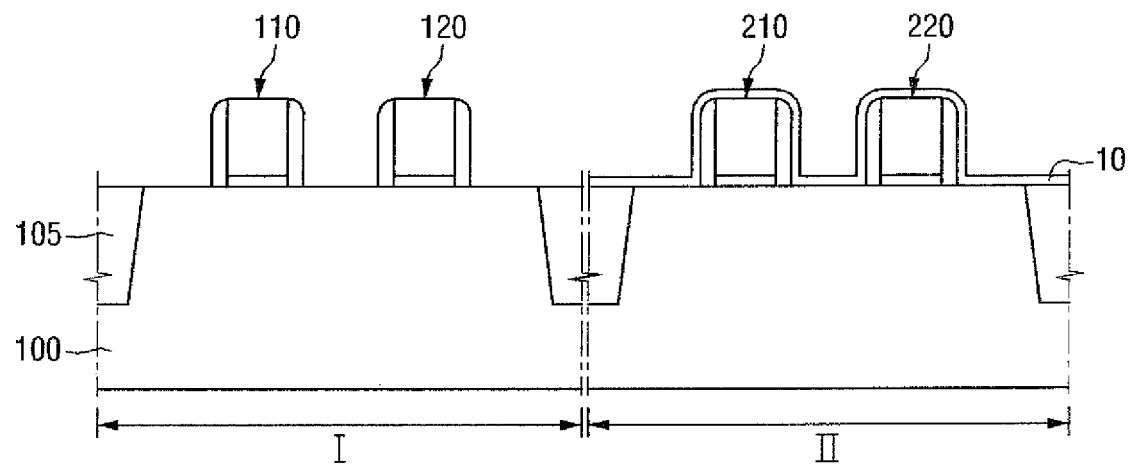
FIGS. 8 to 12 are cross-sectional views illustrating process steps in a method for fabricating a semiconductor device according to an exemplary embodiment of the inventive concept.

Referring to FIG. 8, a blocking pattern 10 is formed on a substrate 100 in a second active region II.

For example, a blocking layer (not shown) is formed on the substrate 100 in a first active region I and second active region II. The blocking layer is formed on first to fourth gate patterns 110, 120, 210, and 220.

Thereafter, the blocking layer formed in the first active region I is removed, thereby exposing the substrate 100 of the first active region I, the first gate pattern 110 and the second gate pattern 120 and forming the blocking pattern 10 in the second active region II. In an exemplary embodiment, after the blocking layer of the first active region I is removed, a portion of the blocking layer may cover spacers of the first gate pattern 110 and the second gate pattern 120.

Figure 9:
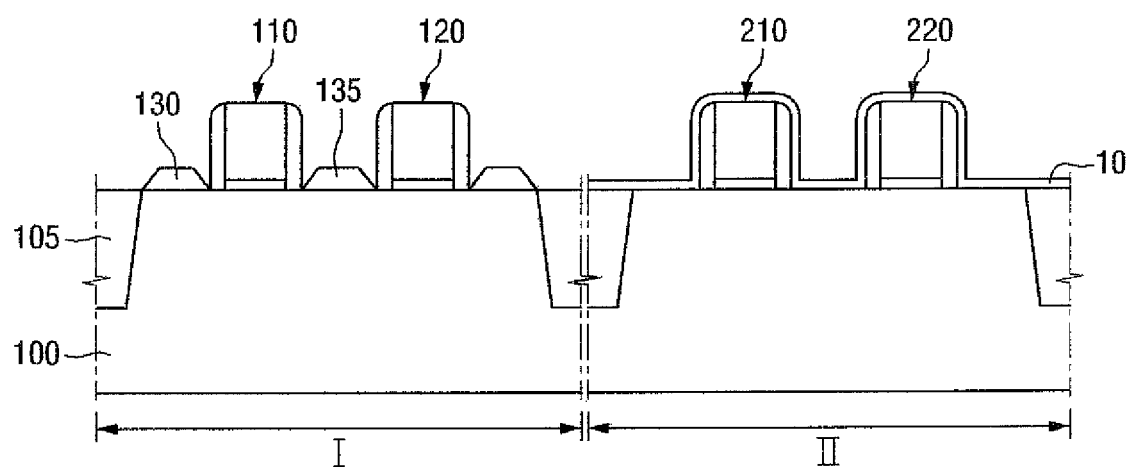

Referring to FIG. 9, a first sacrificial epitaxial layer 130 and a second sacrificial epitaxial layer 135 are formed on the substrate 100. For example, the first sacrificial epitaxial layer 130 is formed between the isolation layer 105 and the first gate pattern 110. The second sacrificial epitaxial layer 135 is formed between the first gate pattern 110 and the second gate pattern 120. The first sacrificial epitaxial layer 130 and the second sacrificial epitaxial layer 135 are formed on a top surface of the substrate 100. For example, the first and second sacrificial epitaxial layers may be grown in an epitaxy growth process and may have a facet sidewall.

The first sacrificial epitaxial layer 130 and the second sacrificial epitaxial layer 135 may include, for example, a silicon epitaxial layer or a silicon germanium epitaxial layer. The first sacrificial epitaxial layer 130 includes a facet sidewall which is sloped at an angle with respect to the top surface of the substrate 100. The first sacrificial epitaxial layer 130 and the second sacrificial epitaxial layer 135 may include, for example, impurities.

Figure 10:
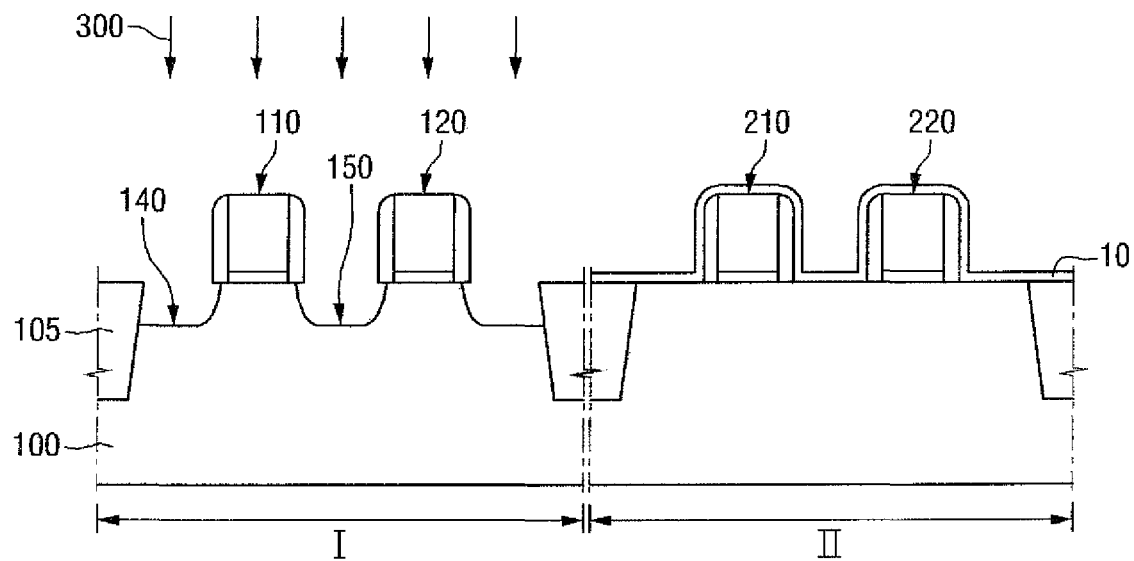

Referring to FIG. 10, the first recess 140 is formed between the first gate pattern 110 and the isolation layer 105 and between the second gate pattern 120 and the isolation layer 105, and the second recess 150 is formed between the first gate pattern 110 and the second gate pattern 120 using a first etching process 300.

The first etching process 300 for forming the first recess 140 and the second recess 150 may include, for example, a dry etching process. The first etching process 300 may be performed with or without, for example, etchant gases in a plasma state.

The first recess 140 exposes a side surface of an isolation layer 105.

Figure 11:
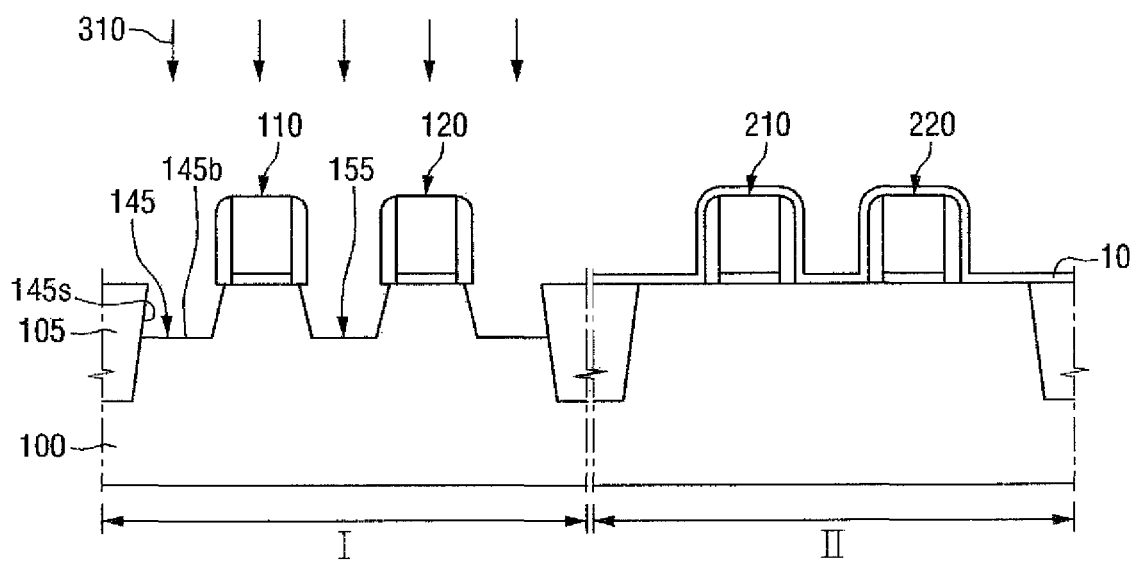

Referring to FIG. 11, a third recess 145 and a fourth recess 155 may be formed by etching the first recess 140 and the second recess 150 formed in the first active region I using a second etching process 310. The second etching process 310 may include, for example, a wet etching process using an etchant having different etch rate depending on a crystallographic orientation of a substrate. For example, the etchant includes ammonium hydroxide (NH$_4$OH), but the inventive concept is not limited thereto.

The third recess 145 and the fourth recess 15, which are adjacent to the first gate pattern 110 and the second gate pattern 120, respectively, may have either sigma (Σ) shaped profiles or wedge (V) shaped profiles.

Figure 12:
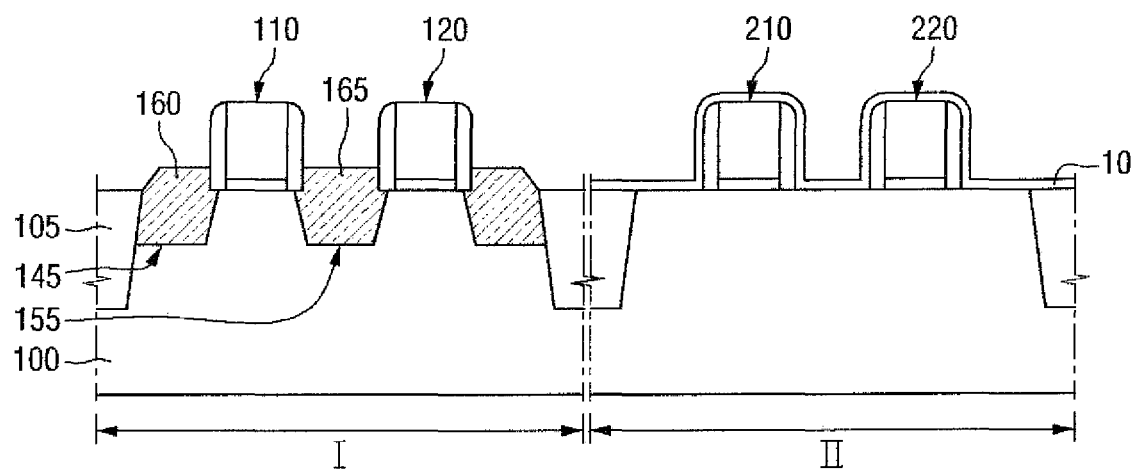

Referring to FIG. 12, a first semiconductor pattern 160 and a second semiconductor pattern 165 are formed in the third recess 145 and the fourth recess 155, respectively. The first semiconductor pattern 160 and the second semiconductor pattern 165 may be formed on a top surface of the substrate 100. For example, the first and second semiconductor patterns 160 and 165 are elevated from a boundary between the first gate pattern 110 and the substrate 100, but the inventive concept is not limited thereto.

Although not shown in FIG. 12, a blocking layer may be formed on the substrate 100, thereby covering the first active region I and the second active region II. The blocking layer covering the second active region II may be removed, thereby forming a blocking pattern on the first active region I. Here, the substrate 100 of the second active region II, the third gate pattern 210 and the fourth gate pattern 220 may be exposed. Thereafter, second source/drain may be formed at both sides of the third gate pattern 210 and the fourth gate pattern 220 formed in the second active region II.

A method for fabricating a semiconductor device according to an exemplary embodiment of the inventive concept will be described with reference to FIGS. 8, 9, and 13. This method is substantially the same as the method described above, except that a third recess, a fourth recess and semiconductor patterns are formed in-situ, and the following description will focus on differences between these approaches.

Figure 13:
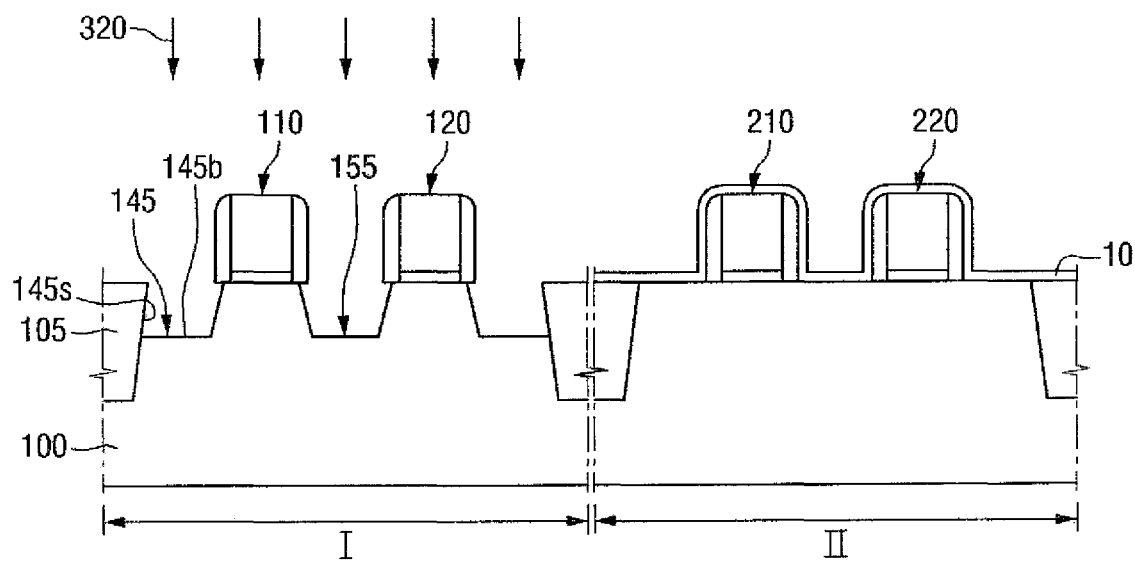
FIG. 13 is a cross-sectional view illustrating process steps in a method for fabricating a semiconductor device according to an exemplary embodiment of the inventive concept.

FIG. 13 is a cross-sectional view illustrating process steps in a method for fabricating a semiconductor device according to an exemplary embodiment of the inventive concept.

Referring to FIGS. 8 and 9, a first sacrificial epitaxial layer 130 and a second sacrificial epitaxial layer 135 are formed on side surfaces of the first gate pattern 110 and the second gate pattern 120 formed in the first active region I.

Referring to FIG. 13, a third recess 145 and a fourth recess 155 may be formed by etching the first sacrificial epitaxial layer 130, the second sacrificial epitaxial layer 135 and the substrate 100 formed in the first active region I using a third etching process 320. The third etching process 320 for forming the third recess 145 and the fourth recess 155 may be, for example, a dry etching process in which the substrate 100 may be isotropically etched. The etching gas used in the dry etching may include, for example, hydrogen chloride and/or chlorine.

For example, the first sacrificial epitaxial layer 130 and the substrate 100 are simultaneously removed in the third etching process 320, thereby forming the third recess 145 between the first gate pattern 110 and the isolation layer 105 and between the second gate pattern 120 and the isolation layer 105. The second sacrificial epitaxial layer 135 and the substrate 100 are simultaneously removed in the third etching process 320, thereby forming the fourth recess 155 between the first gate pattern 110 and the second gate pattern 120. The third and fourth recesses 145 and 155 may have a side surface having a silicon (111) crystal plane.

The third recess 145 and the fourth recess 155, which are adjacent to the first gate pattern 110 and the second gate pattern 120, respectively, may have either sigma (Σ) shaped profiles or wedge shaped profiles, e.g., profiles of a lying-sideways "V". The first sacrificial epitaxial layer 130 and the second sacrificial epitaxial layer 135 may have a facet sidewall having a step difference between the top surface of the facet sidewall and the top surface of the substrate 100. Depending on the step difference, the recesses adjacent to the gate patterns 110 and 120 may have either sigma (Σ) shaped profiles or wedge shaped profiles.

The third recesses 145 and 155 undercut the first gate pattern 110 and the second gate pattern 120. For example, the first gate pattern 110 and the second gate pattern 120 have overhang portions which are not disposed on the substrate 100.

Referring again to FIG. 12, a first semiconductor pattern 160 and a second semiconductor pattern 165 are formed in the third recess 145 and the fourth recess 155, respectively. The first semiconductor pattern 160 and the second semiconductor pattern 165 are formed on a top surface of the substrate 100, and thus are elevated from the boundary between the first gate pattern 110 and the substrate 100, but the inventive concept is not limited thereto.

The first semiconductor pattern 160 and the second semiconductor pattern 165 may be formed by epitaxially growing a semiconductor material in the third recess 145 and the fourth recess 155. For example, the first semiconductor pattern 160 and the second semiconductor pattern 165 may be single crystal epitaxial layers. The first semiconductor pattern 160 and the second semiconductor pattern 165 apply tensile or compressive stress to channel regions, by including materials having different lattice constants from the substrate 100, but the inventive concept is not limited thereto.

According to an exemplary embodiment of the inventive concept, the first sacrificial epitaxial layer 130, the second sacrificial epitaxial layer 135, the third recess 145, the fourth recess 155, the first semiconductor pattern 160 and the second semiconductor pattern 165 may be formed in-situ. For example, a series of processes, which are shown in FIGS. 9, 13 and 12 in turn, may be performed using an epitaxial process equipment for forming the first semiconductor pattern 160 and the second semiconductor pattern 165.

The third recess 145 and the fourth recess 155 having either sigma (Σ) shaped profiles or profiles shaped of "V" lying sideways may be formed by the third etching process 320 using the first sacrificial epitaxial layer 130 and the second sacrificial epitaxial layer 135.

The in-situ process may eliminate an unnecessary cleaning process, thereby simplifying the process.

Figure 14:
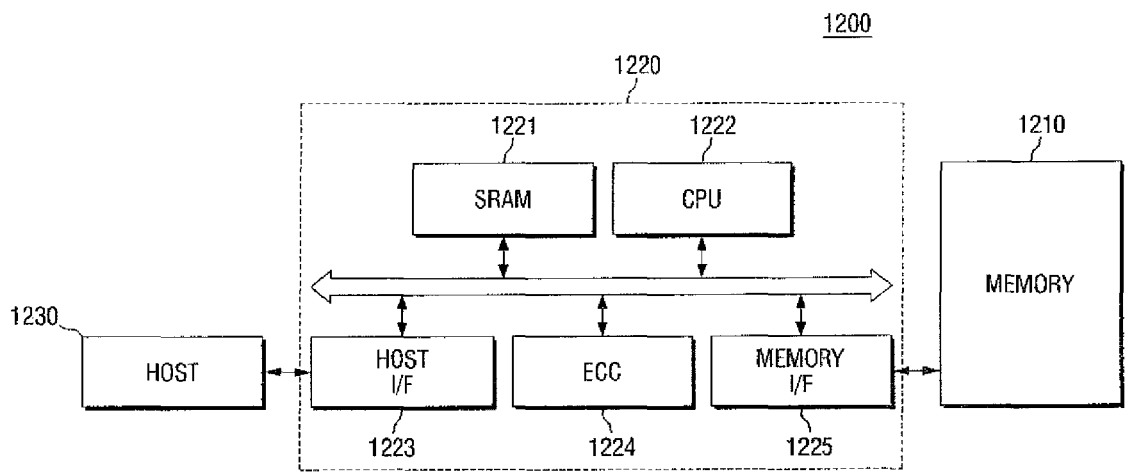
FIG. 14 is a block diagram of a memory card including a semiconductor device according to an exemplary embodiment of the inventive concept.

FIG. 14 is a block diagram of a memory card including a semiconductor device according to an exemplary embodiment of the inventive concept.

Referring to FIG. 14, a memory card 1200 includes a semiconductor memory device 1210 formed according to an exemplary embodiment of the inventive concept. The memory card 1200 includes a memory controller 1220 controlling data exchange between a host 1230 and the semiconductor memory device 1210. A static random access memory (SRAM) 1221 may be used as an operating memory of a central processing unit 1222. A host interface 1223 may operates using a protocol for exchanging data between the host 1230 and the memory card 1200. An error correction code (ECC) 1224 may serve to detect and correct an error of data read from the memory 1210. A memory interface (I/F) 1225 may interface with the memory 1210. The central processing unit 1222 may serve to control operation associated with the data exchange of the memory controller 1220.

Figure 15:
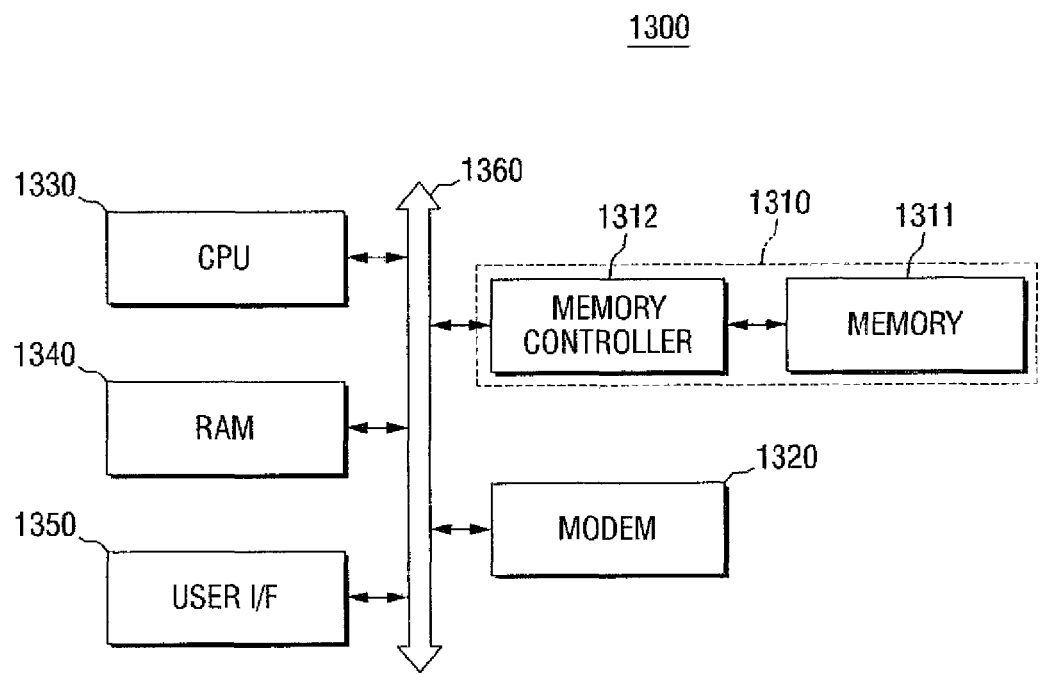
FIG. 15 is a block diagram of an information processing system using a semiconductor device according to an exemplary embodiment of the inventive concept.

FIG. 15 is a block diagram of an information processing system using a semiconductor device according to an exemplary embodiment of the inventive concept.

Referring to FIG. 15, the information processing system 1300 includes a memory system 1310. The memory system 1310 includes a semiconductor device 1311 according to an exemplary embodiment of the inventive concept. The information processing system 1300 includes a memory system 1310, a modem 1320, a central processing unit 1330, an RAM 1340 and a user interface (I/F) 1350, which are electrically connected to a system bus 1360. The memory system 1310 includes a memory 1311 and a memory controller 1312 and may have substantially the same configuration as that of the memory card 1200 as shown in FIG. 14. The data processed by the central processing unit 1330 or the data received from an external device may be stored in the memory system 1310. The information processing system 1300 may be applied to a memory card, a solid state disk (SSD), a camera image sensor and other various chip sets. For example, the memory system 1310 may employ an SSD. In this case, the information processing system 1300 may process a large amount of data in a stable, reliable manner.

Figure 16:
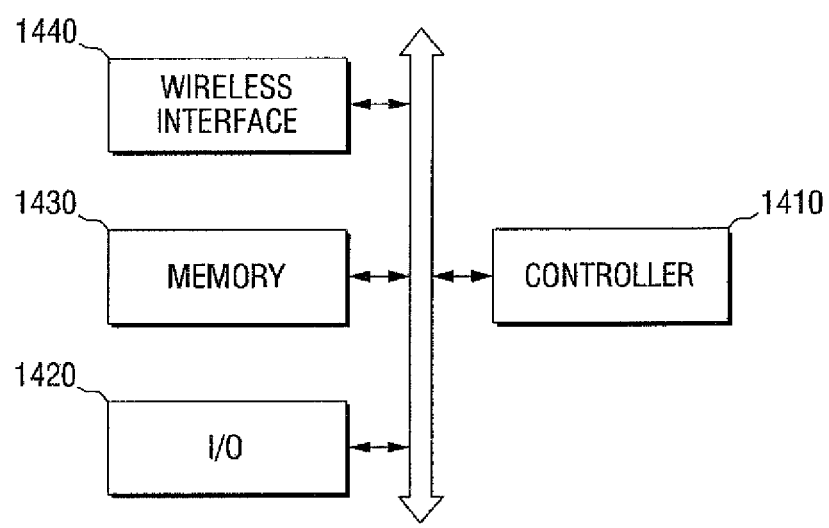
FIG. 16 is a block diagram of an electronic system including a semiconductor device according to an exemplary embodiment of the inventive concept.

FIG. 16 is a block diagram of an electronic system including a semiconductor device according to an exemplary embodiment of the inventive concept.

Referring to FIG. 16, the electronic system 1400 may be applied to a personal digital assistant (PDA), a portable computer, a web tablet, a wireless phone, a mobile phone, a digital music player, a memory card, or any type of electronic device capable of transmitting and/or receiving information in a wireless environment.

The electronic system 1400 includes a controller 1410, an input/output device (I/O) 1420, a memory 1430, and a wireless interface 1440. Here, the memory 1430 may include various semiconductor devices according to an exemplary embodiment of the inventive concept. The controller 1410 may include a microprocessor, a digital signal processor, and the like. The memory 430 may store data and/or commands (or user data) processed by the controller 1410. The wireless interface 1440 may be used to transmit data to a wireless data network or receive data from the communication network. The wireless interface 1440 may include an antenna or a wireless transceiver. The electronic system 1400 may use a third generation communication system protocol, such as CDMA, GSM, NADC, E-TDMA, WCDMA, or CDMA2000.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method for fabricating a semiconductor device comprising:
    forming a gate pattern on a first region of a substrate;
    forming an epitaxial layer on a second region of the substrate; and
    forming a recess in the second region of the substrate by etching the epitaxial layer and the substrate underneath the epitaxial layer,
    wherein the first region is adjacent to the second region,
    wherein the etching of the epitaxial layer and the substrate comprises:
        etching the epitaxial layer and the substrate to form a recessed portion in the substrate, wherein the recessed portion includes a flat bottom in the second region and a curved surface extended from the flat bottom to the gate pattern; and
        etching the recessed portion using an etchant having different etch rates depending on a crystallographic orientation, thereby forming the recess having a tip thereof under the gate pattern, and
    wherein the epitaxial layer is entirely removed during forming the recess in the second region of the substrate.

2. The method of claim 1,
    wherein the recess undercuts the gate pattern.

3. The method of claim 1,
    wherein the recess has a sigma (Σ) shaped or wedge (V) shaped profile.

4. The method of claim 3, further comprising forming a semiconductor pattern in the recess.

5. The method of claim 4,
    wherein the epitaxial layer, the recess and the semiconductor pattern are formed in-situ.

6. The method of claim 3,
    wherein the etching of the epitaxial layer and the substrate is performed by a dry etching process using hydrogen chloride or chlorine gas as an etching gas.

7. The method of claim 1,
    wherein the recess has a sigma (Σ) shaped profile or a wedge (V) shaped profile.

8. A method for fabricating a semiconductor device comprising:
    forming a first gate pattern and a second gate pattern adjacent to the first gate pattern on a PMOS transistor forming region of a substrate defined by an isolation layer;
    forming a first epitaxial layer on the substrate between the isolation layer and the first gate pattern and forming a second epitaxial layer on the substrate between the first gate pattern and the second gate pattern; and
    forming a first recess between the isolation layer and the first gate pattern and a second recess between the first gate pattern and the second gate pattern by etching the first epitaxial layer, the second epitaxial layer and the substrate,
    wherein the etching of the first epitaxial layer, the second epitaxial layer and the substrate comprises:
        etching the first epitaxial layer, the second epitaxial layer and the substrate to form a first recessed portion and a second recessed portion in the substrate, wherein the first recessed portion includes a first flat bottom and a first curved surface, the first curved surface extended from the first flat bottom to the first gate pattern; and
        etching the first recessed portion using an etchant having different etch rates depending on a crystallographic orientation to form the first recess and the second recess having a sigma (Σ) shaped profile or a wedge (V) shaped profile.

9. The method of claim 8,
    wherein the first and second recesses undercut the first and second gate patterns.

10. The method of claim 8,
    wherein the first recess and the second recess have a sigma (Σ) shaped profile or a wedge (V) shaped profile.

11. The method of claim 10, further comprising:
    forming a semiconductor pattern in each of the first recess and the second recess, wherein the first epitaxial layer, the second epitaxial layer, the first recess, the second recess and the semiconductor pattern are formed in-situ.

12. The method of claim 8,
wherein the first recess exposes a side surface of the isolation layer, and the second recess is symmetrically formed about a center line equally spaced from the first gate pattern and the second gate pattern.

13. The method of claim 8,
wherein the substrate further includes an NMOS transistor region having a third gate pattern formed thereon, and when the first and second epitaxial layers are formed, the method further comprises forming a source/drain region epitaxially grown from the substrate adjacent the third gate pattern.

14. A method for fabricating a semiconductor device comprising:
forming a first gate pattern and a second gate pattern on a substrate;
forming an epitaxial layer on the substrate between the first and the second gate patterns, wherein the epitaxial layer includes a facet sidewall and the epitaxial layer includes a predetermined thickness; and
forming a recess between the first and the second gate patterns by etching the epitaxial layer and the substrate underneath the epitaxial layer, wherein the recess undercuts the first and the second gate patterns and has a first tip under the first gate pattern and a second tip under the second gate pattern,
wherein the etching the epitaxial layer and the substrate underneath the epitaxial layer comprises:
performing a first etching process for etching the epitaxial layer and the substrate to form a recessed portion in the substrate, wherein the recessed portion includes a flat bottom and a curved surface extended from the flat bottom to a bottom surface of the gate pattern; and
performing a second etching process for etching the recessed portion using an etchant having different etch rates depending on a crystallographic orientation, thereby forming the recess having a side surface of an (111) crystal plane, and
wherein the epitaxial layer is entirely removed by the first etching process.

15. The method of claim 14,
wherein when the predetermined thickness is greater than a critical value, the curved surface includes tangent lines having positive slopes along the curved surface, and when the predetermined thickness is less than the critical value, the curved surface includes tangent lines changing from a positive slope to a negative slope as the curved surface approaches the first gate pattern.

16. The method of claim 14,
wherein the second etching process includes a wet etching process using an etchant including ammonium hydroxide (NH$_4$OH).

17. The method of claim 14,
wherein the first etching process includes a dry etching process that uses a hydrogen chloride or chlorine gas as an etching gas.

18. A method for fabricating a semiconductor device comprising:
forming a first gate pattern and second gate pattern adjacent to the first gate pattern on a substrate;
forming an epitaxial layer between the first gate pattern and the second gate pattern;
forming a U-shaped recess in the substrate by removing the epitaxial layer and the substrate underneath the epitaxial layer through an etching process; and
forming a semiconductor pattern in the U-shaped recess,
wherein a part of the substrate overlapped with the first gate pattern and the second gate pattern is removed by the etching process, and
wherein the epitaxial layer is entirely removed by the etching process.

19. The method of claim 18,
wherein a side surface of the U-shaped recess includes a first point and a second point farther than the first point from a boundary between the first gate pattern and the substrate, and wherein a width of the U-shaped recess at the boundary is substantially the same as a width of the U-shaped recess at the first point and a width of the U-shaped recess at the second point.

20. The method of claim 18,
wherein a width of the U-shaped recess decreases as a depth from a boundary between the first gate pattern and the substrate increases.

* * * * *